United States Patent [19]

Kobayashi

[11] Patent Number: 4,806,877
[45] Date of Patent: Feb. 21, 1989

[54] AMPLIFIER HAVING A CASCADE CIRCUIT

[75] Inventor: Osamu Kobayashi, Yokohama, Japan

[73] Assignee: Fujitsu Limited, Kanagawa, Japan

[21] Appl. No.: 57,194

[22] Filed: Jun. 3, 1987

[30] Foreign Application Priority Data

Jun. 10, 1986 [JP] Japan .................. 61-134473

[51] Int. Cl.$^4$ ............................. H03F 3/45
[52] U.S. Cl. ................... 330/253; 330/260; 330/277; 330/294; 330/300; 330/311
[58] Field of Search ........... 330/253, 260, 277, 294, 330/300, 311

[56] References Cited

U.S. PATENT DOCUMENTS 4,518,926 5/1985 Swanson ............................. 330/253

Primary Examiner—James B. Mullins
Attorney, Agent, or Firm—Armstrong, Nikaido, Marmelstein & Kubovcik

[57] ABSTRACT

An amplifier having a cascade circuit which comprises a first and a second transistors connected in cascade. To suppress the signal voltage change at the common connecting node between the first and the second transistors, the gates or the bases of the two transistors are commonly connected to the signal input terminal.

22 Claims, 10 Drawing Sheets

1st EMBODIMENT

1st EMBODIMENT

2nd EMBODIMENT

OPAMP HAVING CASCADE CIRCUITS OF 1st EMBODIMENT

OPAMP HAVING CASCADE CIRCUITS OF 2nd EMBODIMENT

AMP HAVING A CASCADE CIRCUIT OF 1st EMBODIMENT

AMP HAVING A CASCADE CIRCUIT OF 2nd EMBODIMENT

3rd EMBODIMENT

4th EMBODIMENT

5th EMBODIMENT

OPAMP

OPAMP $V_o = (a+1) \cdot V_i$

OPAMP EQUIVAVENT TO Fig. 10

FREQUENCY CHARACTERISTICS EXPLAINING PROBLEMS OF PRIOR ART

FOLDED TYPE

OPAMP

AMPLIFIER HAVING A CASCADE CIRCUIT

BACKGROUND OF THE INVENTION

1. Field of the Invention

The present invention relates to an amplifier having a cascade circuit, more particularly to a structure for keeping down the signal voltage generated at the node of the two transistors connected in cascade.

An amplifier circuit such as an operational amplifier is usually operated by using a negative feedback circuit. When the input signal has a high frequency, however, the negative feedback easily turns to positive feedback due to floating capacitances and so forth, so that the output undesirably oscillates. Therefore, some means of preventing oscillation at high frequency input signals is required.

Especially, operational amplifiers are very often used in an analog circuit. Therefore, the operating speed of the analog circuit is determined mainly by the operating speed of the operational amplifiers. When the operational amplifiers are constructed by metal oxide semiconductor (MOS) transistors, the driving performance of he output-stage transistor is lowered at a high frequency range because the nutual conductance $g_m$ of the MOS transistor is lower by one or two orders than that of the bipolar transistor when the sizes of these transistors are the same. The lower driving performance also causes the oeprational amplifier to be turned to a positive feedback, and the positive feedback causes an oscillation of the output, resulting in a lowered operating speed or an unstable operation. Thus, a wide band, stable and high speed operational amplifier is required.

2. Description of the Related Art

An operational amplifier is often constructed by a differential amplifier stage and an output stage. The differential amplifier stage is usually constructed by cascade circuits each having two MOS transistors connected in series.

In a conventional cascade circuit, the gate electrode of one of the two transistors is connected to a fixed potential source, to suppress the amplitude at the connecting point between the two transistors. Further, to prevent an oscillation at the output of the operational amplifier, a phase compensating capacitor is connected between the above-mentioned connecting point nd the output end, to lower the gain of the amplifier at a high frequency range as disclosed in, for example, Japanese Unexamined Patent Publication No. 59-43613 (Hitachi), and as described later in more detail with reference to the drawings.

The above-mentioned conventional amplifier, however, still has a disadvantage of oscillation at a high frequency range. That is, even though the cascade circuits of the prior art enable the sinal amplitude of the connecting point to be kept low, the suppression of the signal amplitude is not sufficient and a further improvement is necessary.

SUMMARY OF THE INVENTION

An object of the present invention is to expand the frequency range and to improve the stability and operating speed of an amplifier having a cascade circuit.

Another object of the present invention is to provide the above amplifier having a cascade circuit in which the signal amplitude at the connecting point between transistors is suppressed to zero.

To attain the above object there is provided, according to the present invention, an amplifier having a cascade circuit, said amplifier comprising: an input terminal for receiving an input signal, an output terminal, an output stage circuit, a phase compensation means, a first transistor having a first electrode and a second electrode for forming a current path therebetween, and a control electrode for controlling the current path, and a second transistor having a first electrode and a second electrode for forming a current path therebetween, and a control electrode for controlling the current path.

The first transistor and the second transist constitutes the cascade circuit. The control electrodes of the first and second transistors are commonly connected to the iput terminal The first electrode of the first transistor is connected to the second electrode of the second transistor through a common connecting node. The first electrode of the second transistor is connected to an output signal current terminal of the cascade circuit, and to the input of the output stage circuit, and the phase compensation means is connected between the output of the output stage circuit and the common connecting node. The output of the output stage circuit is connected to the output teminal.

In the above, an input signal is commonly applied to the first and second transistors of he cascade circuit, whereby the signal voltage amplitude of the node of the first and second transistors at the center point, i.e., the common connecting node, of the cascade circuit can be made zero by an appropriate selection of transistor sizes. Therefore, it is possible to eliminate the passage of a signal through the phase compensation means to the output of the circuit from the cascade circuit.

BRIEF DESCRIPTION OF THE DRAWINGS

The above objects and features of the present invention will be more apparent from the following description of the preferred embodiments with reference to the attached drawings, wherein.

DESCRIPTION OF THE PREFERRED EMBODIMENTS

For a better understanding of the embodiments of the present invention, conventioal amplifiers and the problems therein will first be described with reference to FIGS. 10 through 16.

Figure 10:
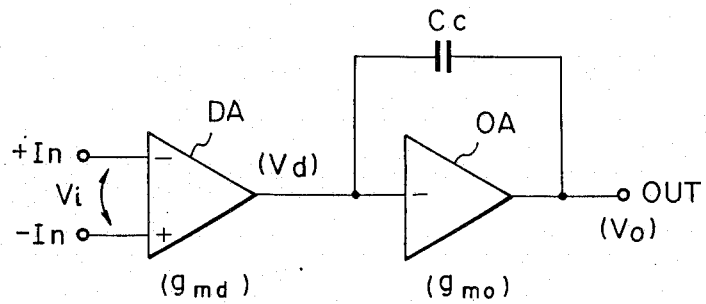
FIG. 10 shows a general construction of a conventional operational amplifier.

FIG. 10 shows the general construction of a conventional operational amplifier, which is constructed by a differential stage DA having a noninverting input terminal (+In) and an inverting input terminal (−In), and an output stage OA receiving, as an input, the output voltage $V_d$ of the differential stage DA. The phase of the noninverting input voltage, also referred to as +In, is inverted by the differential stage DA. The phase of the inverting input voltage (−In) is not inverted by the differential stage DA. The voltage difference $V_i$ between (+In) and (−In) is thus amplified to give the output voltage $V_d$. The phase of the voltage $V_d$ is inverted by the output stage OA to give the output voltage of the operational amplifier.

Figure 11:
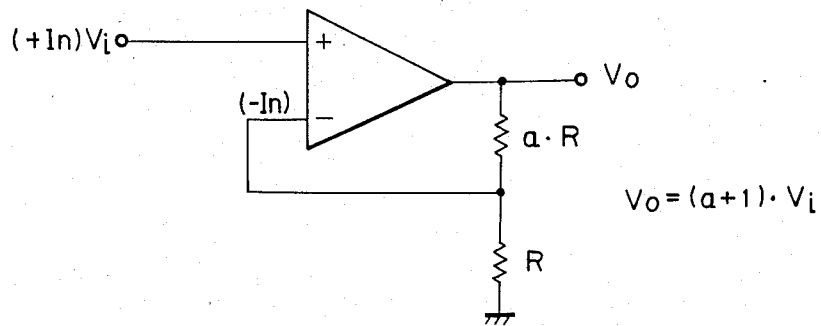
FIG. 11 is a circuit diagram of a conventional operational amplifier for explaining a feedback circuit.

Usually, the operational amplifier is used by applying a negative feedback loop between the output OUT and the inverting input (−In), as shown in FIG. 11. In FIG. 11, a negative feedback loop through a resistor a·R is provided between the output $V_o$ and the inverted input (−In). The output voltage $V_o$ is expressed as $V_o = -(a+1)\cdot V_i$. The gain of the operational amplifier in this case is $(a+1)$. When $a=0$, the gain is mathematically equal to 1.

Referring back to FIG. 10, under the negative feedback, oscillation at the output OUT must be prevented when a high frequency input signal is applied to the noninverted input ((+In). To prevent such oscillation at high frequencies, a phase compensation capacitor $C_C$ is inserted between the output OU of the output stae OA and the output of the differential stage DA. The phase compensation capacitor $C_C$ acts, in the high frequency range, as a feedback capacitor which lowers the gain of the output stage OA to suppress the oscillation at the output OUT.

Figure 12:
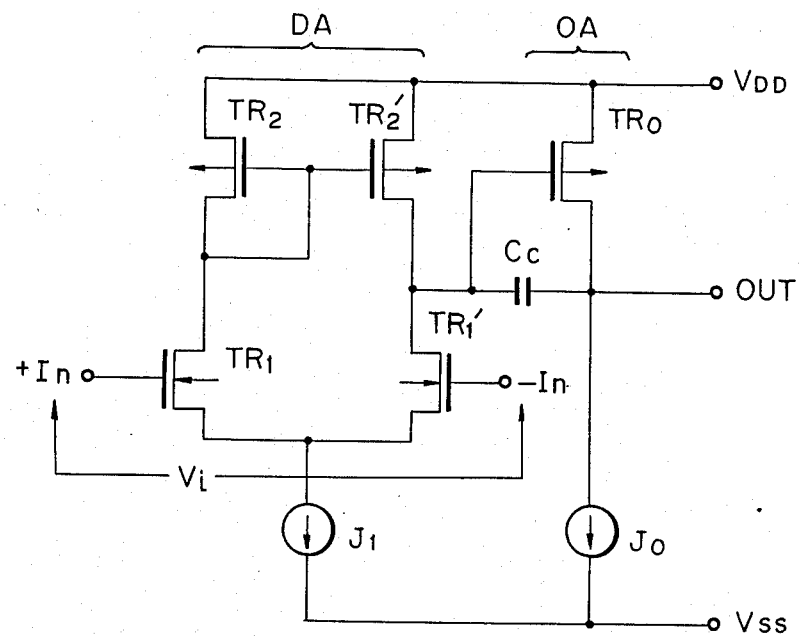
FIG. 12 is an equivalent circuit diagram of the conventional operational amplifier shown in FIG. 10.

FIG. 12 is a circuit diagram equivalent to the operational amplifier shown in FIG. 10. In FIG. 12, the differential stage DA includes transistors TR1, TR1', TR2, TR2', and TR0. The phase compensation capacitor $C_C$ is connected between the output OUT and the output node (also referred to as $V_d$) of the differential stage DA.

The mechanism of oscillation in the high frequency range is now described.

The input voltage difference $V_i$ changes a current flowing through the output node $V_d$ of the differential stage DA. The output voltage $V_d$ of the differential stage DA is determined by the current flowing through the transistor TR1' and TR2' and by the drain resistance of TR1' and TR2' and floating capacitors on the node $V_d$. Also, the voltage $V_d$ changes a current flowing through the output transistor TR0. The output voltage OUT of the output stage OA is determined by the current flowing through the transistor TR0 and the current source $J_0$ and by the drain resistance of TR0 and floating capacitors on the output OUT. When the input voltage difference $V_i$ is in a high frequency range, the voltage phase is delayed by 90 degrees in each of the differential stage DA and the output stage OA. Thus, a total of 180 degrees of phase delay is produced between the input voltage difference $V_i$ and the output voltage OUT. Even when a negative feedback loop is provided between the output OUT and the inverted input (−In), the phase delay causes the operational amplifier to be turned to a positive feedback state, resulting in an oscillation at the output OUT.

The phase compensation capacitor $C_C$ acts as a negative feedback loop at a high frequency range in the output stage OA so as to constitute a Millar integrator, which is intended to suppress the oscillation at the output by lowering the gain of the output stage OA in the high frequency range.

There is, however, a problem in the above-mentioned conventional operational amplifier. That is, the mutual conductance $g_m$ of an MOS transistor is not so great that, if a capacitance is applied as a load on the output terminal OUT of the operational amplifier, the drive performance of the operational amplifier in the high frequency range will be reduced due to the load capacitance, and the amplification rate of the transistor TR0 of the final stage will fall. If this happens, the phenomenon will occur of the output $V_d$ of the differential stage DA passing through the phase compensation capacitor $C_C$ and directly appearing at the output $V_o$ of the operational amplifier. With the usual operation of an operational amplifier, the transistor TR0 of the final stage OA receives a signal at its gate as an input and gives out a signal to is drain, so that operational amplifier operates to invert the phase 180 degrees by the transistor of the final stage. With an operation in which the output $V_d$ of the differential stage DA passes through the phase compensation capacitor $C_C$ as it is, however, the phase does not invert. If such an operational stage is entered, when connecting a negative feedback circuit to the outside of the operational amplifier as shown in FIG. 11, the phase relationship is the opposite of the usual phase relationship, with the result that a positive feedback occurs. Therefore, the entire circuit including the operational amplifier becomes unstable.

Figure 13:
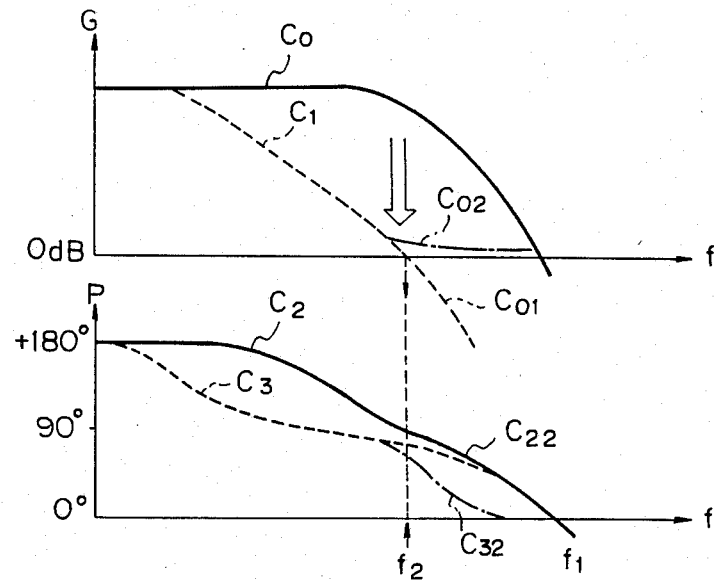
FIG. 13 is a graph showing frequency characteristics for explaining the problems of the prior art.

The effect and the problem in the conventional operational amplifier will be more apparent from the graph shown in FIG. 13 which depicts the frequency characteristics of the prior art.

In FIG. 13, the relationship between the gain G and the frequncy f is illustrated in the upper graph, and the relationship between the phase difference P and the frequency f is illustrated in the lower graph, and the relationship between the phase difference P and the frequency f is illustrated in the lower graph. In both graphs, the solid curves $C_0$ and $C_2$ represent the frequency characteristics when the phase compensation capacitor $C_C$ is not employed; the dash curves $C_{1 z]l}$, $C$, $C_3$, and $C_{22}$ represent the frequency characteristics when the phase compensation capacitor Cz]hd C z]l is employed and when the output signal $V_d$ doesn't pass through the capacitor $C_C$; and the dash-dot curves Chd 02 and $C_{32}$ represent frequency characteristics when the output signal $V_d$ passes through the phase compensation capacitor $C_C$.

The curve $C_0$ shows that the gain of the operational amplifier is not lowered until the frequency f exceeds a high frequency $f_0$. The curve $C_2$ shows that the phase difference gradually decreases along with the increase of the frequency, and reaches zero at a high frequency $f_1$. At the frequency $f_1$, the curve $C_0$ shows that the gain G is not lower than 0 dB. Therefore, when the phase compensation capacitor $C_C$ is not employed, a positive feedback easily occurs at a high frequency range so as to generate an oscillation.

The curve $C_1$ shows that the gain G of the operational amplifier decreases rapidly along with the increase of the frequency, when the capacitor $C_C$ is employed. The curve $C_3$ shows that the phase difference P decreases at first from 180 degrees to about 90 degrees along with the increase of the frequency under the frequency $f_0$. This decrease of the phase difference P occurs because the output stage OA employs the phase compensation cpacitor $C_C$.

The curves $C_{01}$ and $C_{22}$ shows that, when the output signal $V_d$ of the differential stage DA is assumed not to have passed through the phase compensation capacitor $C_C$, the gain of the operational amplifier will be desirably decreased to be lower than 1 (0 dB) in the high frequency region higher than $f_0$, and the phase difference P will gradually decrease to zero in that region. Since the gain G is lower than 0 dB at the high frequency $f_1$ at which the phase difference P is zero, oscillation will not occur.

In practice, however, as shown by the dash-dot curves, since the output signal $V_d$ of the differential stage DA passes through the phase compensation capacitor $C_C$, the gain G of the operational amplifier is kept higher than 0 dB even in the high frequency region. Therefore, when the phase difference P reaches zero, as shown by the curve $C_{32}$, the positive feedback is generated and oscillation easily occurs.

Further, as a nature of a MOS transistor, the driving performance of the output transistor TR0 is decreased in the high frequency region. The decreased driving performance also causes the signal to pass from the output $V_d$ of the differential stage DA through the capacitor $C_C$ to the output OUT.

If the driving performance of the differential stage DA is made higher in order to ensure a high-speed and wide-range operational amplifier, the gain G at the output OUT is also increased through the capacitor $C_C$, resulting in easy oscillation.

To solve the above-mentioned problems, it has been conventionally proposed to connect one end, opposite to the output terminal OUT, of the phase compensating capacitor $C_C$ to a point at which the signal voltage amplitude is smaller than that at the node $V_d$. That is, the capacitor $C_C$ is connected to the point at which a signal is transmitted as a current but is not transmitted as a voltage.

In the prior art, the transistors for the differential stage have been arranged in a cascade circuit, and a phase compensation capacitor ahs been connected at the center point, i.e., a common connecting node, thereof. The center point of the cascade circuit has a small voltage amplitude, so even if the conductance $2\pi f_s \cdot C_C$ of the phase compensation capacitor is large in the high frequency region, the passage of the signal can be kept small, where $f_s$ is the input frequency and $C_C$ is the capacitance.

Figure 14:
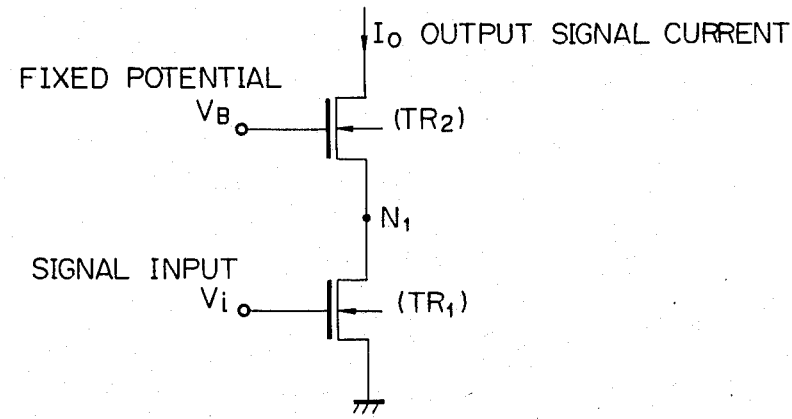
FIG. 14 is a circuit diagram of a conventional cascade circuit.

FIG. 14 shows an example of a prior art cascade circuit, which has a transistor (TR1) and transistor (TR2), the first transistor TR1 being an n-channel MOS transistor (TR1) which receives at its gate an input signal $V_i$ and is connected at its source to a low potential power source, the drain thereof being connected to a node $N_1$ to which the source of the second transistor (TR2) is also connected. Further, the second transistor (TR2) has a source connected to the drain of (TR1), a gate connected to a suitable fixed potential source $V_B$, and a drain used as an output signal current ($I_0$) terminal.

Figure 15:
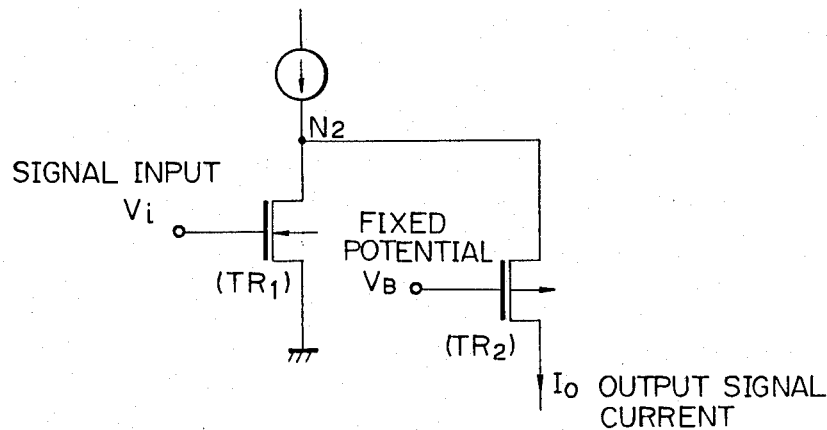
FIG. 15 is a circuit diagram of a conventional folded cascade circuit.

FIG. 15 shows a prior art example of a folded cascade circuit of a CMOS construction, the first transistor (TR1) being an n-channel MOS transistor and the second transistor (TR2) being a p-channel MOS transistor. The source of TR1 is connected to a low potential power source, its gate is connected to an input signal $V_i$, and a node $N_2$ is connected to the drain of TR1 and to the source of TR2. The node $N_2$ is connected to a constant current source. The gate of the second transistor TR2 has a fixed potential applied in the same way as above, the drain being used as the output signal current terminal $I_0$.

In this way, if a cascade stage construction is used and a load is driven through TR2 with a fixed gate potential, the potential at the center point $N_1$ or $N_2$ of connection of TR1 and TR2 is restrained in amplitude by TR2.

Figure 16:
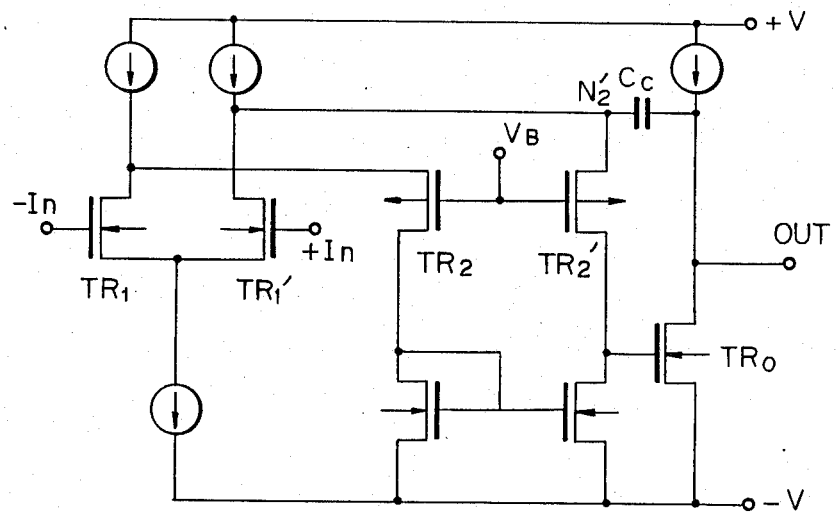
FIG. 16 is a circuit diagram of an improved type of conventional operational amplifier.

FIG. 16 shows an operational amplifier circuit, disclosed in Japanese Unexamined Patent Publication No. 59-43613 (Hitachi), using a conventional cascade circuit. Here, use is made of the folded type cascade circuit of FIG. 15. In the figure, symbols are standardized with those in FIG. 15. The transistors of the first cascade circuit constituting the differential stage are indicated as TR1 and TR2 and the transistors of the other cascade circuit are indicated as TR1' and TR2'. A fixed potential $V_B$ is applied to the gates of TR2 and TR2'. The drain of TR2' is connected to the gate of the transistor TR0 of the output stage. The output of the operational amplifier is indicated as OUT. $C_C$ is the afore-mentioned phase compensation capacitor and is inserted between the node $N_2'$ of TR1' and TR2' and the output OUT. Therefore, since the phase compensation capacitor $C_C$ is connected at the center point $N_2'$ of TR1' and TR2', where the signal amplitude of the differential stage is suppressed because the signal is transmitted through the node $N_2'$ as a current, even if the gain of the transistor TR0 of the output stage falls in the high frequency region, the signal which passes through $C_C$ can be kept small.

The cascade circuits of FIG. 14 and FIG. 15 of the prior art enable the signal potential of the center point $N_1$ and $N_2$ to be kept small, but not small enough, and thus, further improvement is necessary.

Below, examples of the present invention will be explained with reference to the drawings.

Figure 1:
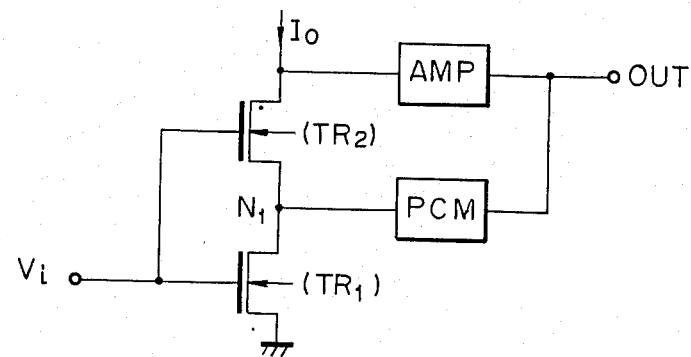
FIG. 1 is a circuit diagram of an amplifier according to a first embodiment of the present invention.

FIG. 1 shows a first embodiment of the present invention, wherein the cascade circuit uses an n-channel enhancement type transistor as the first transistor TR1 and uses an n-channel depletion type transistor as the second transistor TR2. In FIG. 1, the source of the first transistor TR1 connected to a low potential power source, while its drain is connected through a node $N_1$ to the source of the second transistor TR2, the drain of the second transistor TR2 being used as the output current terminal ($I_0$). In this example, an input signal $V_i$ is commonly connected to the gates of the first and second transistors TR1 and TR2.

The drain of the second transistor TR2 is an output of the cascade circuit. The output is connected to an amplifier AMP such as an output stage in an operational amplifier. A phase compensation circuit PCM is connected between the node $N_1$ and the output of the amplifier AMP.

The operation of the cascade circuit shown in FIG. 1 will now be explained. If the gate voltage of the transistor TR1 rises, TR1 tries to pass the current and thus works in the direction of reducing the drain voltage, i.e., the voltage at the node $N_1$. Conversely, the same gate voltage is applied to the gate of the depletion type transistor TR2, which, if the gate voltage rises, works in the direction of raising the source voltage of TR2, i.e., the voltage at the node $N_1$. In this way, TR1 and TR2 work in opposite directions with respect to changes in potential of the node $N_1$, so by appropriately setting the sizes of TR1 and TR2, the signal voltage amplitude of he node $N_1$ can be made zero and it is possible to almost completely eliminate passage of a signal through the phase compensation circuit PCM to the output OUT. In more detail, assuming that the mutual conductance of the first transistor TR1 is $g_{m1}$ and that of the second transistor TR2 is $g_{m2}$, and that the voltage change component at the input $V_i$ is $\Delta V_i$. Then, the drain current $iD_i$ of the first transistor TR1 is expressed as:

$$iD_1 = g_{m1}\Delta V_i.$$

Also, the drain current $iD_2$ of the second transistor TR2 is expressed as $iD_2 = g_{m2}(\Delta V_i \Delta V_{N1})$ where $\Delta V_{N1}$ is the voltage change at the node $N_1$. Since the dain currents $iD_1$ and $iD_2$ are equal to each other, the voltage change $\Delta V_{N1}$ at the node $N_1$ can be expressed as $$\Delta V_{N1} = \frac{g_{m2} - g_{m1}}{g_{m2}} \Delta V_1.$$

Therefore, by setting the mutual conductances $g_{m1}$ and $g_{m2}$ to be equal, the voltage change $V_{N1}$ at the node $N_1$ can be made zero.

Figure 2:
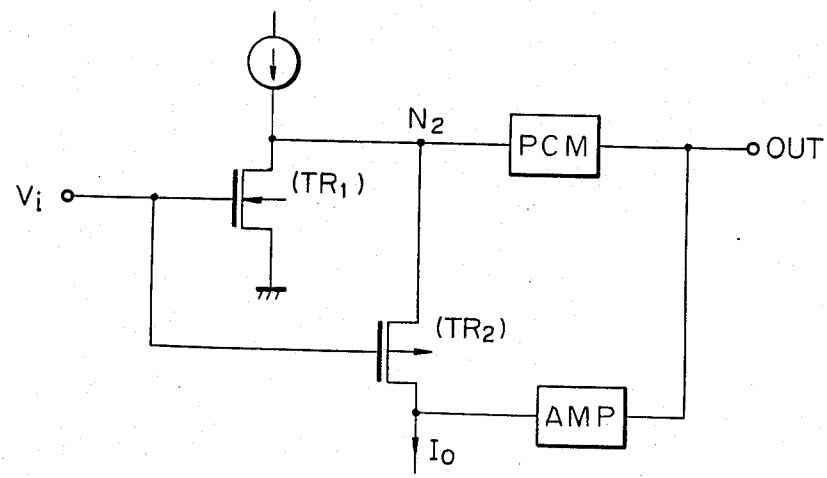
FIG. 2 is a circuit diagram of an amplifier according to a second embodiment o the present invention.

FIG. 2 is a circuit diagram of a second embodiment of the present invention, in which an n-channel enhancement type transistor is used as the first transistor TR1 of the cascade circuit and a p-channel enhancement type transistor is used as the second transistor TR2. In FIG. 2, the source of the first transistor TR1 is connected to a low potential power source and the drain is connected through a node $N_2$ to the source of the second transistor TR2, the drain of the second transistor TR2 being used as an output current terminal ($I_0$). In this embodiment, an input signal $V_i$ is connected commonly to the first and second transistors TR1 and TR2.

The output current terminal $I_0$ is connected to an amplifier AMP such as an output stage in an operational amplifier. A phase compensation circuit PCM is connected between the node $N_2$ and the output of the amplifier AMP.

The operation of the cascade circuit shown in FIG. 2 is basically the same as that in FIG. 1. When the gate voltage of the transistor TR1 rises, TR1 tries to pass the current and so works in the direction of reducing the drain voltage, therefore, the potential of the node $N_2$ connected to the source of TR2. As opposed to this, the same gate potential is applied to the gate of the p-channel type transistor TR2. When the gate potential rises, the source potential of TR2, which is connected to the drain of TR1, moves in an upward direction. Since TR1 and TR2 work in opposite directions with respect to a change in potential of their common node $N_2$, if their sizes are appropriately selected, it is possible to reduce the signal voltage amplitude of he node to zero and to almost completely eliminate passage of a signal through the phase compensation capacitor to the output.

Figure 3:
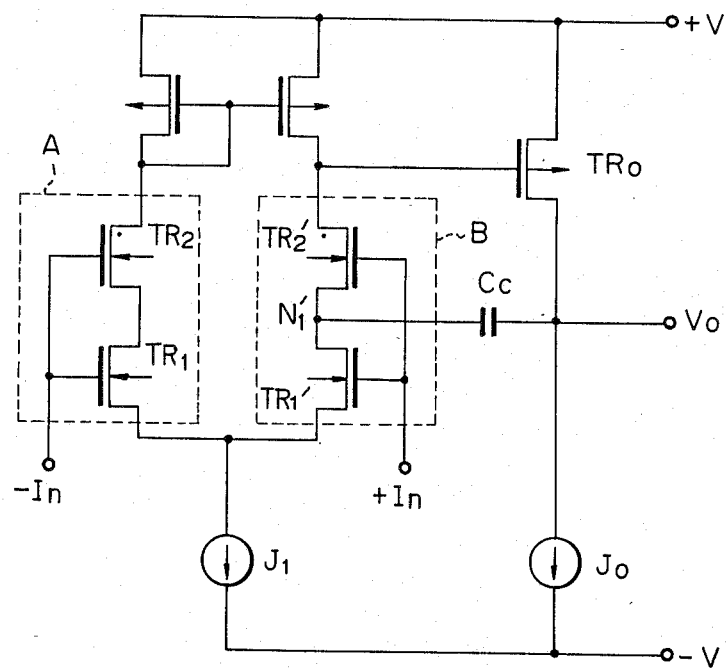
FIG. 3 is a circuit diagram of an operational amplifier having a cascade circuits of the first embodiment.

Next, an example of an operational amplifier of the present invention is shownin FIG. 3. This example employs the cascade circuit to the first embodiment shown in FIG. 1.

In the figure, corresponding to FIG. 1 the same portions are indicated by the same symbols. A and B surrounded by broken lines are first and second cascade circuits constituting a differential stage. The transistors of the cascade circuit A are expressed as TR1 and TR2, and the transistors of the cascade circuit B are expressed as TR1' and TR2'. The gates of TR1 and TR2 are commonly connected to the inverted input terminal ($-$In) of an operational amplifier, and the gates of TR1' and TR2' are commonly connected to the noninverted input terminal ($+$In) of the operational amplifier. $J_1$ and $J_0$ are current sources. TR0 is a transistor of the output stage, whose gate is connected to the output signal current terminal of TR2' and whose drain is connected to the output terminal $V_o$ of the operational amplifier and the center point $N_1$ of the transistors TR1' and TR2' of the cascade circuit B.

Here, prevention of the signal amplitude appearing at the potential of the node $N_1'$ of the transistors TR1' and TR2' is considered. At the differential stage, looking at the $g_m$ of one transistor, the $g_m$ when viewing the current which flows through the drain of TR1' is not the $g_m$ of the transistor TR1'. This is because, since TR1' and the source of TR1 of the other cascade circuit are connected, about half of the $g_m$ of the transistor TR1 appears. For example, if TR1' is selected to be twice the $g_m$ of the transistor TR2, it is possible to make the signal amplitude of the node $N_1'$ zero.

Figure 4:
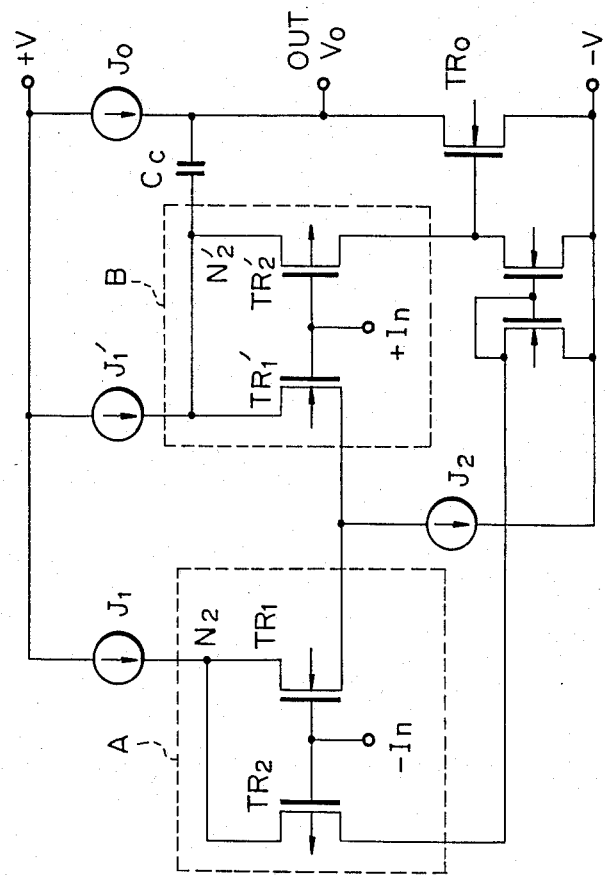
FIG. 4 is an operational amplifier having cascade circuits of the second embodiment.

FIG. 4 is an another example of an operational amplifier of the present invention in which the cascade circuit of the second embodiment is employed. In the figure, A and B surrounded by broken lines are first and second cascade circuits constituting a differential stage. In this case, the example is of the use of a folded cascade circuit of a CMOS construction of the afore-said FIG. 2 as the differential stage. The transistors of the cascade circuit A are expressed as TR1 and TR2, and the transistors of the cascade circuit B are expressed as TR1' and TR2'. The gates of TR1 and TR2 are commonly connected to an input terminal ($-$In) of an operational amplifier,and the gates of TR1' and TR2' are commonly connected to the input terminal ($+$In) of the operational amplifier. $J_1$, $J_1'$, $J_2$, and $J_0$ are current sources. TR0 is a transistor of the output stage, whose gate is connected to the output signal current terminal of TR2' and whose drain is connected to the output terminal $V_o$ of the operational amplifier. The phase compensation capacitor $C_C$ is inserted between the output stage of the operational amplifier and the center point $N_2'$ of the transistors TR1' and TR2' of the cascade circuit B.

The signal amplitude is prevented from appearing at the potential of the node $N_2'$ of the transistors TR1' and TR2' for the same reason mentioned with reference to FIG. 3.

Figure 5:
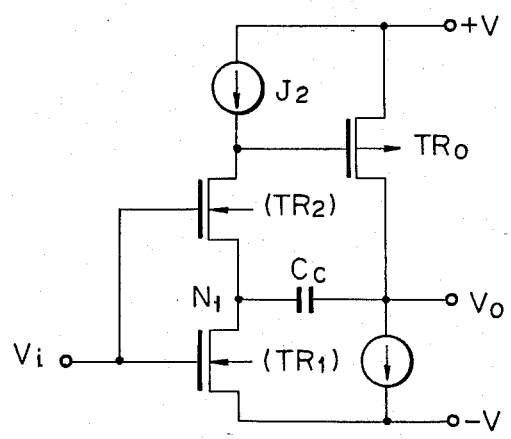
FIG. 5 is a circuit daigram of an amplifier having a cascade circuit of the first embodiment.

FIG. 5 shows another example of an amplifier of the present invention in which the cascade circuit of the first embodiment shown in FIG. 1 is employed. In FIG. 5, the transistors TR1 and TR2 constitute the cascade circuit which is the same as the circuit of FIG. 1. The transistor TR0 constitute the output stage. The phase compensation circuit $C_C$ is connected between the output terminal $V_o$ and the node $N_1$.

Since the voltage change at the node $N_1$ can be minimized for the same reason as mentioned before with reference to FIG. 3, the signal at the node $N_1$ can be prevented from passing through the phase compensation capacitor $C_C$.

Figure 6:
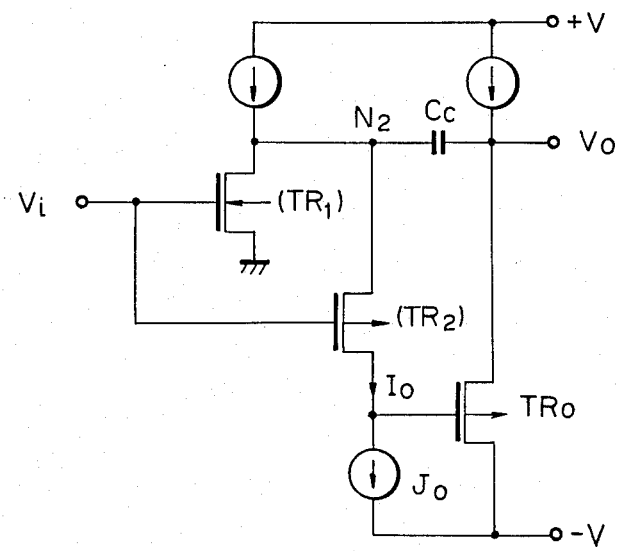
FIG. 6 is a circuit diagram of an amplifier having a cascade circuit of the second embodiment.

FIG. 6 shows still another example of an amplifier of the present invention in which the cascade circuit of the second embodiment shown in FIG. 2 is employed. In the figure, the transistors TR1 and TR2 constitute the folded cascade circuit of FIG. 2. The transistor TR0 constitutes the output stage. The phase compensation circuit $C_C$ is connected between the output terminal $V_o$ and the node $N_2$.

The amplifier of FIG. 6 also provides the same effects as in the circuit of FIG. 5.

In the above, examples were given to the use of an MOS transistor as the embodiments of the present invention, but the present invention is not limited thereto and can be also applied to a bipolar transistor or a junction type field effect transistor. The cascade circuits in these cases are shown in FIG. 7 to FIG. 9, symbols of the parts being standarized withthose of prior examples.

Figure 7:
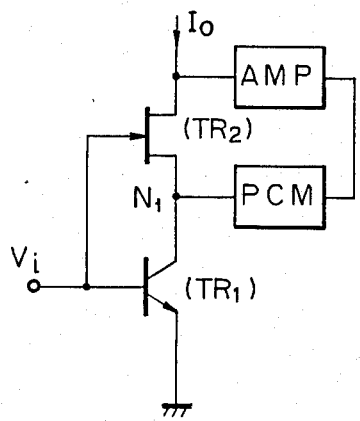
FIG. 7 is a circuit diagram of an amplifier according to a third embodiment of the present invention.

FIG. 7 is an example, according to the third embodiment of the present invention, of the use of a junction FET for the upper stage transistor TR2 and an npn bipolar transistor for the lower stage transistor TR1, an input signal $V_i$ being applied commonly to the gate of the junction FET and the base of the bipolar transistor.

Figure 8:
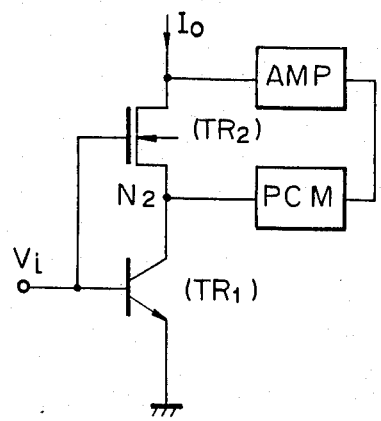
FIG. 8 is a circuit diagram of an amplifier according to a fourth embodiment of the present invention.

FIG. 8 is an example, according to the fourth embodiment of the present invention, of the use of an n-channel depletion type MOS transistor for the upper stage transistor TR2 and an npn bipolar transistor for the lower stage transistor TR1, the input signal $V_i$ being commonly applied to the gate of the depletion type MOS transistor and the base of the bipolar transistor.

Figure 9:
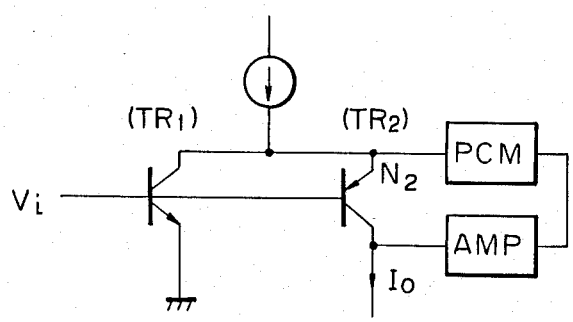
FIG. 9 is a circuit diagram of an amplifier according to a fifth embodiment of the present invention.

Further, FIG. 9 shows an example, according to the fifth embodiment of the present invention by just bipolar transistors, an npn type bipolar transistor being used as the lower stage transistor TR1 and a pnp type bipolar transistor being used as the upper stage TR2, an input signal $V_i$ being applied to the base of the pnp type bipolar transistor and base of the npn type bipolar transistor.

Further, the first and second embodiments shown in FIGS. 3 and 4 of use of the cascade circuits of FIGS. 1 and 2 as the operational amplifiers using the cascade circuit of the present invention, but it is of course possible to replace the cascade circuit with the cascade circuits of FIG. 7 to FIG. 9.

Note that, in the zbove, illustration was made of direct application of the input signal to the gates or bases or transistors TR1 and TR2 constituting the cascade circuit, but it is possible to apply the same after attenuation or leel shift. further, explanation was made with an example using the capacitor $C_C$ as the phase compensation means, but it is possible to use other phase compensation means, for example, a series circuit of a resistance and capacitor.

As mentioned above, according to the present invention, it is possible to make the signal voltage amplitude of the node of two transistors of a cascade circuit almost zero. Further, by connection of a phase compensation capacitor to thenode, it is possible to eliminate the phenomenon of a differential stage signal passing through the phase compensation capacitor in the high frequency region and appearing in the output, resulting in instability in the circuit as a whole.

I claim:

1. An amplifier having a cascade circuit, comprising:
 an input terminal for receiving an input signal
 an output terminal,
 an output stage circuit,
 a phase compensation means,
 a first transistor (TR1) having a first electrode and a second electrode for forming a current path therebetween, and a control electrode for controlling said current path, and
 a second transistor (TR2) having a first electrode and a second electrode for forming a current path therebetween, and a control electrode for controlling said current path,
 said first transistor and said second transistor constituting said cascade circuit,
 said control electrodes of said first and second transistors being commonly connected to said input terminal,
 said first electrode of said first transistor being connected to said secod electrode of said second transistor through a common connecting node,
 said first electrode of said second transistor being connected to an output signal current terminal of said cascade circuit and to the input of said output stage circuit,
 said phase compensation means being connected between the output of said output stage circuit and said common connecting node, said output of said output stage circuit being connected to said output terminal.

2. An amplifier as set forth in claim 1, wherein said phase compensation means is a phase compensating capacitor for lowering the gain at said output terminal.

3. An amplifier as set forth in claim 1, wherein sizes of said first transistor and said second transistor are selected so as to substantially eliminate the voltage change at said common connecting node.

4. An amplifier as set forth in claim 1, further comprising a low potential power source connected to said second electrode of said first transistor.

5. An amplifier as set forth in claim 4, wherein said first transistor is an n-channel enhancement type MOS transistor, and said second transistor is an n-channel depletion type MOS transistor, whereby the output current of said cascade circuit flows into said first electrode of said second transistor.

6. An amplifier as set forth in claim 4, wherein said first transistor is an npn bipolar transistor, and said second transistor is a junction FET, whereby the output current of said cascade circuit flows into said first electrode of said second transistor.

7. An amplifier as set forth in claim 4, wherein said second transistor is an n-channel depletion type MS transistor, and said first transistor is an npn bipolar transistor.

8. An amplifier as set forth in claim 4, further comprising a constant current source for supplying a constant current to said first electrode of said second transistor.

9. An amplifier as set forth in claim 8, wherein said first transistor is an n-channel MOS transistor, and second transistor is a p-channel MS transistor, whereby the output current of said cascade circuit flows out from said first electrode of said second transistor.

10. An amplifier as set forth in claim 8, wherein said first transistor is an npn bipolar transistor, and second transistor is a pnp bipolar transistor, whereby the output current of said cascade circuit flows o from said first electrode of said second transistor.

11. An amplifier as set forth in claim 1, wherein said first transistor and said second transistor have the same polarities to constitute an unfolded type cascade circuit.

12. An amplifier as set forth in claim 1, wherein said first transistor and said second transistor have opposite polarities to constitute a folded type cascade circuit.

13. An operational amplifier having two cascade circuits forming a differential stage, comprising:
two input terminals for receiving input signals;
an output terminal;
an output stage circuit; and
a phase compensation means,
wherein each of said two cascade circuits includes,
(a) first transistor (TR1) having a first electrode and a second electrode for forming a current path therebetween, and a control electrode for controlling said current path, and
(b) a second transistor (TR2) having a first electrode and a second electrode for forming a current path therebetween, and a control electrode for controlling said current path, wherein
said control electrodes of said first and second transistors are commonly connected to one of said two input terminals,
said first electrode of said first transistor is connected to said second electrode of said second transistor through a common connecting node,
said first electrode of said second transistor in one of said two cascade circuits is connected to an output signal current terminal of said cascade circuit and to the input of said output stage circuit, and
said phase compensation means is connected between the output of said output stage circuit and said common connecting node in one of said two cascade circuits, said output of said output stae circuit being connected to said output terminal.

14. An operational amplifier as set forth in claim 13, wherein said phase compensation means is a phase compensation capacitor for lowering the gain at said output terminal.

15. An operational amplifier as set forth in claim 13, further comprising a low potential source connected to said second electrode of said first transistor through a current source.

16. An operational amplifier as set forth in claim 15, wherein said first transistor is an n-channel enhancement type MOS transistor, and said second transistor is an n-channel depletion type MOS transistor, whereby the output current of said cascade circuit flows into said first electrode of said second transistor.

17. An operational amplifier as set forth in claim 15, further comprising a constant current source for supplying a constant current to said first electrode of said second transistor.

18. An operational amplifier as set forth in claim 17, wherein said first transistor is an n-channel MOS transistor, and said second transistor is a p-channel MOS transistor, whereby the output current of said cascade circuit flows out from said first electrode of said second transistor.

19. An operational amplifier as set forth in claim 17, wherein said first transistor is an npn bipolar transistor, and said second transistor is a pnp bipolar transistor, whereby the output current of said cascade circuit flows out from said first electrode of said second transistor.

20. An operational amplifier as set forth in claim 13, wherein sizes of said first transistor and said second transistor are selected so as to substantially eliminate the voltage change at said common connecting node.

21. An operational amplifier as set forth in claim 13, wherein said first transistor and said second transistor have the same polarities to constitute an unfolded type cascade circuit.

22. An operational amplifier as set forth in claim 13, wherein said first transistor and second transistor have the opposite polarities to constitute a folded cascade circuit.

* * * * *